United States Patent
Driessen et al.

(10) Patent No.: US 6,774,374 B1
(45) Date of Patent: Aug. 10, 2004

(54) ISOLATION MOUNTS FOR USE WITH VACUUM CHAMBERS AND THEIR APPLICATION IN LITHOGRAPHIC PROJECTION APPARATUSES

(75) Inventors: Johannes C. Driessen, Eindhoven (NL); Theodorus H. J. Bisschops, Eindhoven (NL); Jakob Vijfvinkel, Eindhoven (NL); Marinus J. J. Dona, Veldhoven (NL); Mark T. Meuwese, Geldrop (NL); Ronald M. Schneider, Geldrop (NL); Michel A. Mors, Eindhoven (NL); Hugo M. Visser, Utrecht (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 09/551,323

(22) Filed: Apr. 17, 2000

(30) Foreign Application Priority Data

Apr. 19, 1999 (EP) ............................................ 99201194

(51) Int. Cl.7 ............................................. G03B 27/54
(52) U.S. Cl. .................... 250/492.2; 250/557; 250/568; 250/492.23; 356/400; 356/401; 355/67; 355/53
(58) Field of Search .......................... 250/492.2, 557, 250/548, 492.23; 356/401, 400; 355/67, 53

(56) References Cited

U.S. PATENT DOCUMENTS

| | | | | |
|---|---|---|---|---|
| 4,383,178 A | | 5/1983 | Shibata et al. | |
| 4,904,141 A | | 2/1990 | Contin | |
| 4,952,299 A | * | 8/1990 | Chrisos et al. | 204/298.25 |
| 4,993,696 A | | 2/1991 | Furukawa et al. | |
| 5,100,237 A | * | 3/1992 | Wittekoek et al. | 356/401 |
| 5,746,562 A | | 5/1998 | Hasegawa et al. | |
| 6,038,015 A | * | 3/2000 | Kawata | 355/67 |
| 6,421,112 B1 | * | 7/2002 | Bisschops et al. | 355/53 |

OTHER PUBLICATIONS

Ceglio et al., "Front–end design issues in soft–x–ray projection lithography," Applied Optics, vol. 32 (No. 34), pp. 7050–7056, (Dec. 1, 1993).

* cited by examiner

Primary Examiner—John R. Lee
Assistant Examiner—Zia R. Hashmi
(74) Attorney, Agent, or Firm—Pillsbury Winthrop LLP

(57) ABSTRACT

A reference frame provided in a vacuum chamber is supported by support pillars extending through and isolated from the vacuum chamber walls to isolate the reference frame from vibrations in the vacuum chamber. The gap between the support pillar and the vacuum chamber wall may be sealed by a low-stiffness seal. The low stiffness seal may be a three part seal allowing relative motion in six-degrees of freedom.

19 Claims, 3 Drawing Sheets

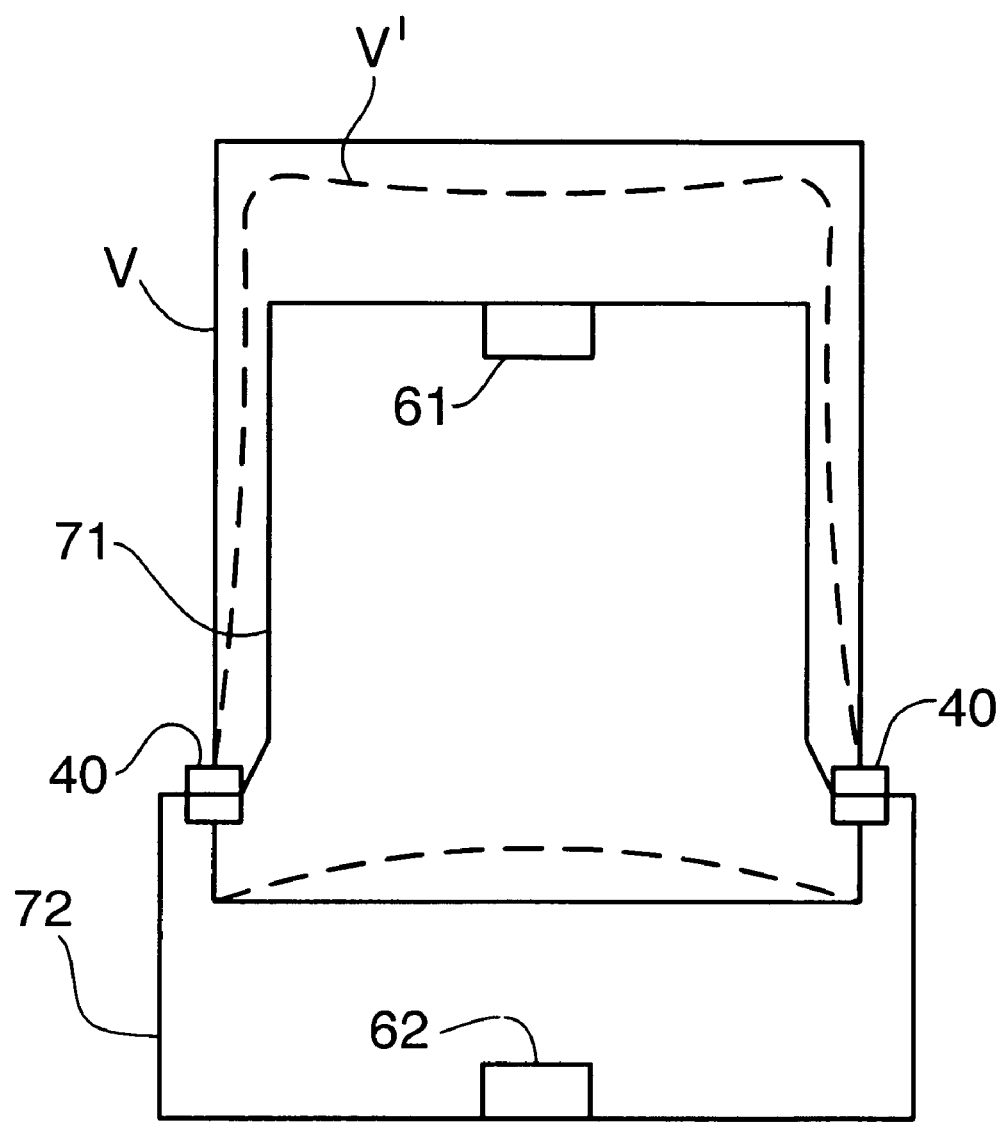

ISOLATION MOUNTS FOR USE WITH VACUUM CHAMBERS AND THEIR APPLICATION IN LITHOGRAPHIC PROJECTION APPARATUSES

BACKGROUND OF THE INVENTION

1. Field of the Invention

The present invention relates to isolation mounts for use in vacuum chambers. More particularly, the invention relates to the application of such devices in lithographic projection apparatuses.

2. Discussion of Related Art

For the sake of simplicity, the projection system may hereinafter be referred to as the "lens"; however, this term should be broadly interpreted as encompassing various types of projection system, including refractive optics, reflective optics, catadioptric systems, and charged particle optics, for example. The radiation system may also include elements operating according to any of these principles for directing, shaping or controlling the projection beam of radiation, and such elements may also be referred to below, collectively or singularly, as a "lens". In addition, the first and second object tables may be referred to as the "mask table" and the "substrate table", respectively. Further, the lithographic apparatus may be of a type having two or more mask tables and/or two or more substrate tables. In such "multiple stage" devices the additional tables may be used in parallel, or preparatory steps may be carried out on one or more stages while one or more other stages are being used for exposures. Twin stage lithographic apparatuses are described in International Patent Applications WO 98/28665 and WO 98/40791, for example.

Lithographic projection apparatuses can be used, for example, in the manufacture of integrated circuits (ICs). In such a case, the mask (reticle) may contain a circuit pattern corresponding to an individual layer of the IC, and this pattern can be imaged onto a target area (die) on a substrate (silicon wafer) which has been coated with a layer of photosensitive material (resist). In general, a single wafer will contain a whole network of adjacent dies which are successively irradiated via the reticle, one at a time. In one type of lithographic projection apparatus, each die is irradiated by exposing the entire reticle pattern onto the die in one go; such an apparatus is commonly referred to as a wafer stepper. In an alternative apparatus—which is commonly referred to as a step-and-scan apparatus—each die is irradiated by progressively scanning the reticle pattern under the projection beam in a given reference direction (the "scanning" direction) while synchronously scanning the wafer table parallel or anti-parallel to this direction; since, in general, the projection system will have a magnification factor M (generally <1), the speed v at which the wafer table is scanned will be a factor M times that at which the reticle table is scanned. More information with regard to lithographic devices as here described can be gleaned from International Patent Application WO 97/33205.

In a lithographic apparatus, the size of features that can be imaged onto the wafer is limited by the wavelength of the projection radiation. To produce integrated circuits with a higher density of devices and hence higher operating speeds, it is desirable to be able to image smaller features. Whilst most current lithographic projection apparatus employ ultraviolet light generated by mercury lamps or excimer lasers, it has been proposed to use shorter wavelength radiation of around 13 nm. Such radiation is termed extreme ultraviolet (EUV) or soft x-ray, and possible sources include laser plasma sources or synchrotron radiation from electron storage rings. An outline design of a lithographic projection apparatus using synchrotron radiation is described in "Synchrotron radiation sources and condensers for projection x-ray lithography", J B Murphy et al, Applied Optics Vol. 32 No. 24 pp 6920–6929 (1993).

Other proposed radiation types include electron beams and ion beams. These types of beam share with EUV the requirement that the beam path, including the mask, substrate and optical components, be kept in a high vacuum. This is to prevent absorption and/or scattering of the beam, whereby a total pressure of less than about $10^{-6}$ millibar is typically necessary for such charged particle beams. Wafers can be contaminated, and optical elements for EUV radiation can be spoiled, by the deposition of carbon layers on their surface, which imposes the additional requirement that hydrocarbon partial pressures should generally be kept below $10^{-8}$ or $10^{-9}$ millibar. Otherwise, for apparatuses using EUV radiation, the total vacuum need pressure only be $10^{-3}$ or $10^{-4}$ mbar, which would typically be considered a rough vacuum.

Further information with regard to the use of electron beams in lithography can be gleaned, for example, from U.S. Pat. No. 5,079,122 and U.S. Pat. No. 5,260,151, as well as from EP-A-0 965 888.

Working in such a high vacuum imposes quite onerous conditions on the components that must be put into the vacuum and on the vacuum chamber seals, especially those around any part of the apparatus where a motion must be fed-through to components inside the chamber from the exterior. For components inside the chamber, materials that minimize or eliminate contaminant and total outgassing, i.e. both outgassing from the materials themselves and from gases adsorbed on their surfaces, should be used. It would be very desirable to be able to reduce or circumvent such restrictions.

SUMMARY OF THE INVENTION

It is an object of the present invention to provide an improved isolation mount that can be used in a vacuum chamber of a lithographic projection apparatus, for example to support a metrology frame.

According to the present invention, this and other objects are achieved in a lithographic projection apparatus that has a radiation system for supplying a projection beam of radiation; a first object table provided with a mask holder for holding a mask; a second object table provided with a substrate holder for holding a substrate; and a projection system for imaging an irradiated portion of the mask onto a target portion of the substrate. The lithographic projection apparatus also has a vacuum chamber having a wall enclosing at least one of the first and second object tables, the vacuum chamber wall having at least one aperture therein; a reference frame provided in the vacuum chamber; a position sensing device for sensing the position of an object in the vacuum chamber relative to the reference frame; and a support member passing through the aperture to support the reference frame from outside the vacuum chamber and to isolate the reference frame from the vacuum chamber wall.

Current lithography apparatuses are designed for use in clean room environments and therefore some steps have conventionally been taken to reduce possible sources of contamination of wafers that are processed by the apparatus.

However, conventional designs of wafer, mask and transfer stages are very complicated and employ large numbers of components for sensor and drive arrangements. Such stages also need to be provided with large numbers of signal and control cables and other utilities. The present invention avoids the difficult and detailed task of making such large numbers of components vacuum-compatible, or replacing them with vacuum-compatible equivalents, by adopting the principle of locating as many components and functions as possible outside the vacuum chamber. The present invention thus avoids the need to vacuum-proof many or most of the numerous components, by providing appropriate mechanical feed-throughs with innovative sealing arrangements. Likewise, the present invention avoids difficulties in reducing vibrations inevitable in vacuum apparatuses particularly where powerful pumps are provided, by isolating as far as possible vibration sensitive components from the vacuum chamber wall.

By supporting the reference frame from outside the vacuum chamber and isolating it from vibrations in the vacuum chamber wall, such vibrations are prevented from degrading the accuracy with which the object tables are positioned and moved, and the reliability of position measurements made relative to the reference frame.

According to another aspect of the invention, a lithographic projection apparatus has a radiation system for supplying a projection beam of radiation; a first object table provided with a mask holder for holding a mask; a second object table provided with a substrate holder for holding a substrate; and a projection system for imaging an irradiated portion of the mask onto a target portion of the substrate. The lithographic projection apparatus of this preferred embodiment has a vacuum chamber having a wall enclosing at least one of the first and second object tables, the vacuum chamber wall having at least one aperture therein; a reference frame extending through the aperture so as to have a first part located in the vacuum chamber and a second part located outside the vacuum chamber; a sensing device having a first component mounted to the first part of the reference frame and a second component mounted on the second part of the reference frame; and a low-stiffness seal for sealing between the vacuum chamber wall and the reference frame.

This arrangement allows the relative positions of two components mounted on the reference frame, one inside and one outside the vacuum chamber, to be maintained constant irrespective of any deformation of the vacuum chamber walls with changes in the pressure differential across them.

A further aspect of the invention is directed to a low-stiffness seal for sealing a space between a vacuum chamber wall and an elongate rod having a longitudinal axis and passing through an aperture in the vacuum chamber wall. The seal includes an annular collar rotatably mountable around the elongate rod and having a first sealing surface concentric with the longitudinal axis;

an intermediate member having second and third sealing surfaces, the second sealing surface being complementary to and opposing the first sealing surface; and a plate member defining an aperture through which the elongated rod passes and a fourth sealing surface complementary to and opposing the third sealing surface, the plate member being mountable to the pressure chamber wall.

The low-stiffness seal of the invention can provide a seal about a rod passing into a vacuum chamber whilst allowing movement of the rod relative to the vacuum chamber wall in six-degrees of freedom.

In a preferred embodiment of the invention, the low-stiffness seal is used to seal around a support pillar of a reference frame provided in a vacuum chamber of a lithographic apparatus.

Another aspect of the invention is directed to a device manufacturing method that includes providing a substrate which is at least partially covered by a layer of energy-sensitive material; providing a mask containing a pattern; projecting an image of at least part of the mask pattern onto a target area of the layer of energy-sensitive material using a projection beam of radiation.

At least one of the substrate and the mask is provided in a vacuum chamber; and the one of the mask or the substrate is positioned relative to a reference frame provided in the vacuum chamber, the reference frame being supported from outside the vacuum chamber and isolated from the walls of the vacuum chamber.

In a manufacturing process using a lithographic projection apparatus according to the invention a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping) metallisation, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

BRIEF DESCRIPTION OF THE DRAWINGS

The present invention and its attendant advantages will be described below with reference to exemplary embodiments and the accompanying schematic drawings, in which:

FIG. 5 depicts a vacuum chamber according to a third embodiment of the invention.

DETAILED DESCRIPTION OF THE PREFERRED EMBODIMENTS

In the various drawings, like parts are indicated by like references.

Embodiment 1

Figure 1:
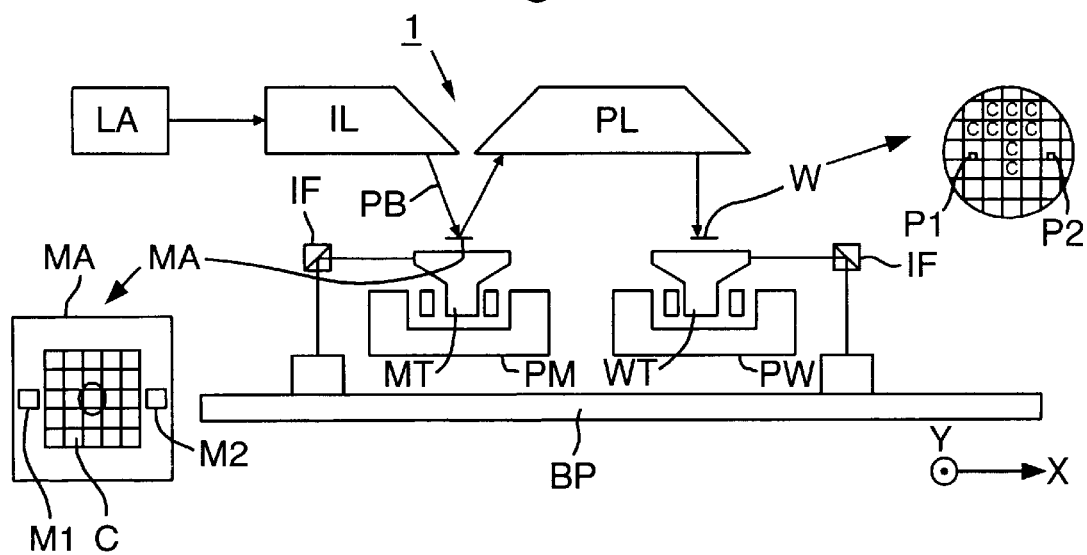
FIG. 1 depicts a lithographic projection apparatus according to a first embodiment of the invention.

FIG. 1 schematically depicts a lithographic projection apparatus 1 according to the invention. The apparatus comprises:

- a radiation system LA, IL for supplying a projection beam PB of radiation (e.g. UV or EUV radiation, electrons or ions);
- a first object table (mask table) MT provided with a mask holder for holding a mask MA (e.g. a reticle), and connected to a first positioning component PM for accurately positioning the mask with respect to item PL;
- a second object table (substrate table) WT provided with a substrate holder for holding a substrate W (e.g. a resist-coated silicon wafer), and connected to a second positioning component PW for accurately positioning the substrate with respect to item PL;
- a projection system ("lens") PL (e.g. a refractive or catadioptric system, a mirror group or an array of field deflectors) for imaging an irradiated portion of the mask MA onto a target portion C (die) of the substrate W.

The radiation system comprises a source LA (e.g. an undulator or wiggler provided around the path of an electron beam in a storage ring or synchrotron, a plasma source, or an electron or ion beam source) which produces a beam of radiation. This beam is passed along various optical components included in illumination system IL, e.g. for the purpose of shaping and/or collimating the resultant beam PB, and/or making it uniformly intense throughout its cross-section.

The beam PB subsequently impinges upon the mask MA which is held in a mask holder on a mask table MT. Having been selectively reflected (or transmitted) by the mask MA, the beam PB passes through the "lens" PL, which focuses the beam PB onto a target area C of the substrate W. With the aid of the positioning component PW and the interferometric displacement measuring device IF, the substrate table WT can be moved accurately, e.g. so as to position different target areas C in the path of the beam PB. Similarly, the positioning component PM and the interferometric displacement measuring device IF can be used to accurately position the mask MA with respect to the path of the beam PB, e.g. after mechanical retrieval of the mask MA from a mask library or during a scanning motion. In general, movement of the object tables MT, WT will be realized with the aid of a long stroke module (course positioning) and a short stroke module (fine positioning), which are not explicitly depicted in FIG. 1.

The depicted apparatus can be used in two different modes:

In step mode, the mask table MT is kept essentially stationary, and an entire mask image is projected in one go (i.e. a single "flash") onto a target area C. The substrate table WT is then shifted in the X and/or Y directions so that a different target area C can be irradiated by the beam PB;

In scan mode, essentially the same scenario applies, except that a given target area C is not exposed in a single "flash". Instead, the mask table MT is movable in a given direction (the so-called "scan direction", e.g. the X direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target area C can be exposed, without having to compromise on resolution.

Figure 2:
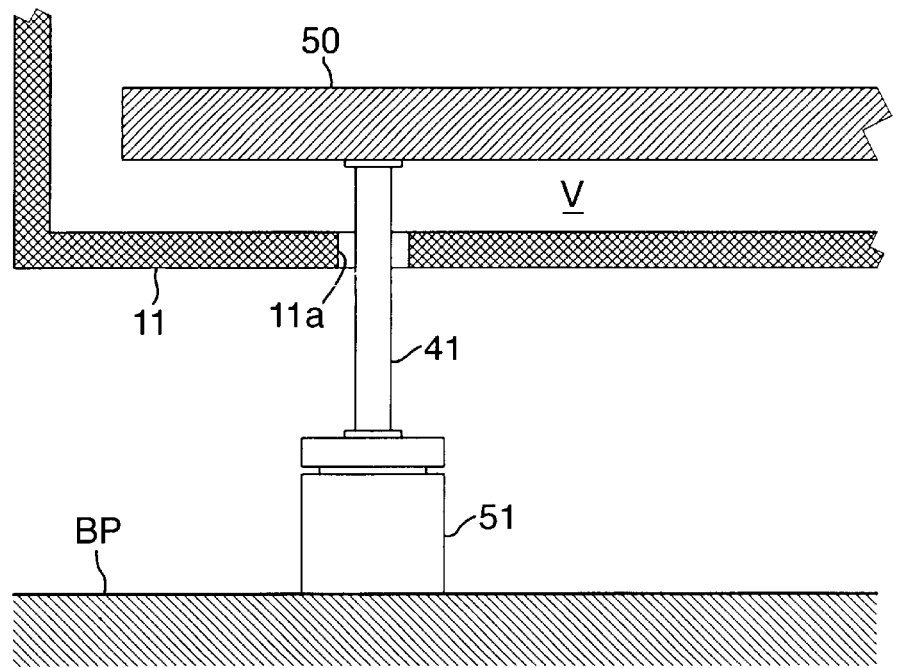
FIG. 2 is a partly cross-sectional view of an isolation mount in the first embodiment of the invention.

In the first embodiment, such items as the wafer table WT, mask table MT and projection lens PL are all positioned relative to a metrology frame (reference frame) 50, shown schematically in FIG. 2. As shown in that Figure, the metrology frame 50 is mounted on support pillars 41 (only one shown) and isolated from the base plate BP by an air mount 51. The air mount 51 can be of conventional type and serves to prevent vibrations in the base plate, which may be caused by external events, being transmitted to the metrology frame 50. This improves the accuracy of the positional measurements in the apparatus.

To further improve the stability of the metrology frame 50, the support pillars 41 are passed through apertures 11a in the vacuum chamber wall 11 and effectively isolated from the vacuum chamber wall 11. The resulting gap in the vacuum chamber wall 11 can be made narrow and long to reduce leakage into the vacuum chamber, or preferably sealed with a low (ideally zero) stiffness seal. In this way vibrations in the vacuum chamber wall 11 are prevented from being transmitted to the metrology frame where they might reduce the accuracy of positional measurements. There is likely to be a relatively high level of vibration in the vacuum chamber wall due to the vacuum pumps and other noisy equipment that must be connected to it. The low stiffness seal may be a bellows, particularly to seal against swivel movements, alone or in combination with other forms of seal.

Embodiment 2

Figure 3:
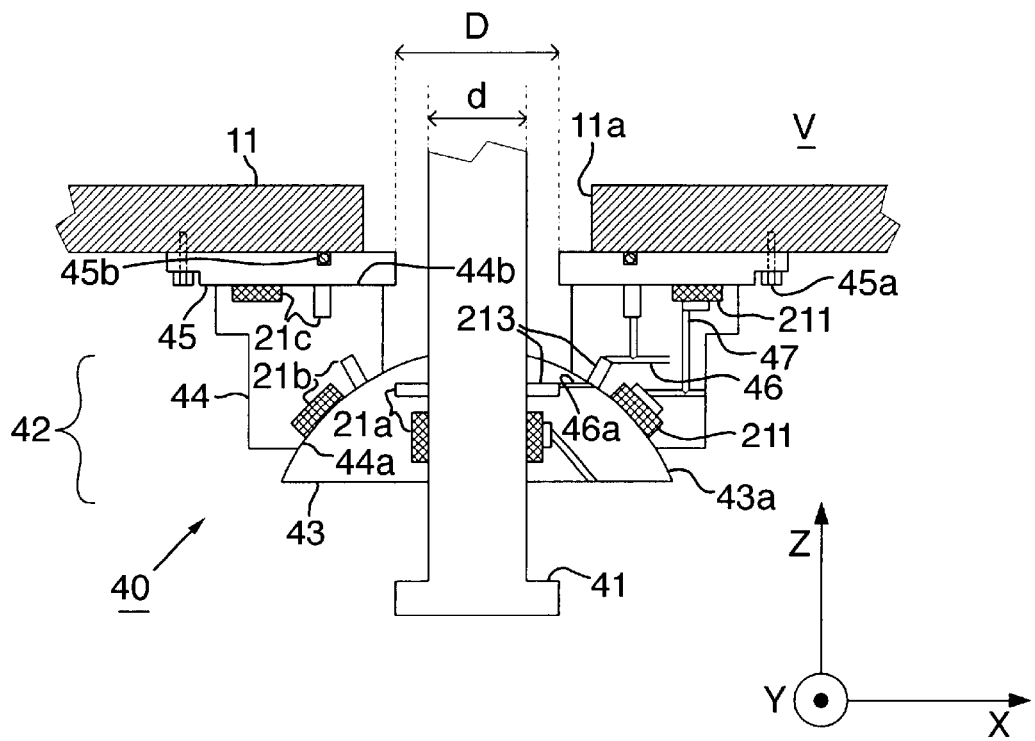
FIG. 3 is a cross-section of an isolation mount according to a second embodiment of the invention.

An isolation support 40 according to a second embodiment of the invention is shown in FIG. 3. The second embodiment differs from the first only in the details of the seal provided between the pillar 41 and the vacuum chamber wall 11. A description of the common parts is therefore omitted for brevity.

The metrology frame 50 is mounted on support pillars 41 (only one shown) which pass through an aperture 11a defined in the vacuum chamber wall 11. In the second embodiment the aperture 11a is sealed by a three part seal 42 which allows the support 41 to move relative to vacuum chamber wall 11 in six degrees of freedom. The three part seal 42 comprises annular collar 43, seat 44 and plate 45. Collar 43 is provided around the pillar 41 and has a convex hemispherical upper surface 43a. The hemispherical surface 43a sits in a complementary concave hemispherical surface 44a in seat 44. The flat upper surface 44b of the seat lies against plate 45.

Three differential gas (air) bearings 21a, b, c are provided in the interfaces in the three part seal; one in the collar 43 around the pillar 41, one in the seat 44 around the concave hemispherical surface 44a and one in the seat 44 around the flat upper surface 44b. These air bearings 21a, b, c are described further below with reference to FIG. 4 and in European Patent Application no 99201193.2 entitled "Gas-Bearings for use in Vacuum Chambers and their Application in Lithographic Apparatus" as well as a concurrently filed U.S. application of similar title (Applicant's ref: P-0133.010) which are incorporated herein by reference. Bearing 21a allows the pillar 41 to be displaced relative to the seal longitudinally and also to rotate about its axis, providing freedom for the pillar to move parallel to the Z-axis and also $\phi_z$ rotation. Bearing 21b allows the hemispherical collar 43 to rotate about three axes, providing $\phi_x$ and $\phi_y$ rotational freedom, as well as further $\phi_z$ freedom. Bearing 21c allows the seat 44 to move sideways relative to plate 45, providing X and Y displacement and also $\phi_z$ rotation freedom for the pillar 41.

Each of the bearings 21a, b, c is a differential air bearing according to the invention and comprises air feeds 211 and evacuation units 213. Clean gas or air is supplied to the air feeds 211 via supply conduits 47 and the evacuation units 213 are connected to vacuum pumps (not shown) via vacuum conduits 46. In the case of the evacuation unit 213 in bearing 21a provided in the collar 43, the vacuum conduit 46a does not lead directly to a vacuum pump but instead communicates with the evacuation unit of bearing 21b in seat 44.

The plate 45 is sealed to the vacuum chamber wall 11 by bolts 45a and, e.g., O-ring 45b in conventional manner. In use, the pressure differential between the atmosphere and the vacuum chamber V will keep the rest of the seal together, but additional constraints can be provided for when the vacuum is released, e.g. for maintenance.

As described above, the three air bearings between them allow six degrees of freedom to the pillar 41; the range of movement allowed in each degree will depend, except in the case of Z and $\phi_y$, on the diameter, d, of the pillar and the diameter, D, of the aperture in plate 45. In this embodiment, which aims to isolate support pillar 41 from vibrations in the vacuum chamber wall, only a relatively small range of movement, sufficient to accommodate the maximum amplitude of the expected vibrations, is necessary.

Figure 4:
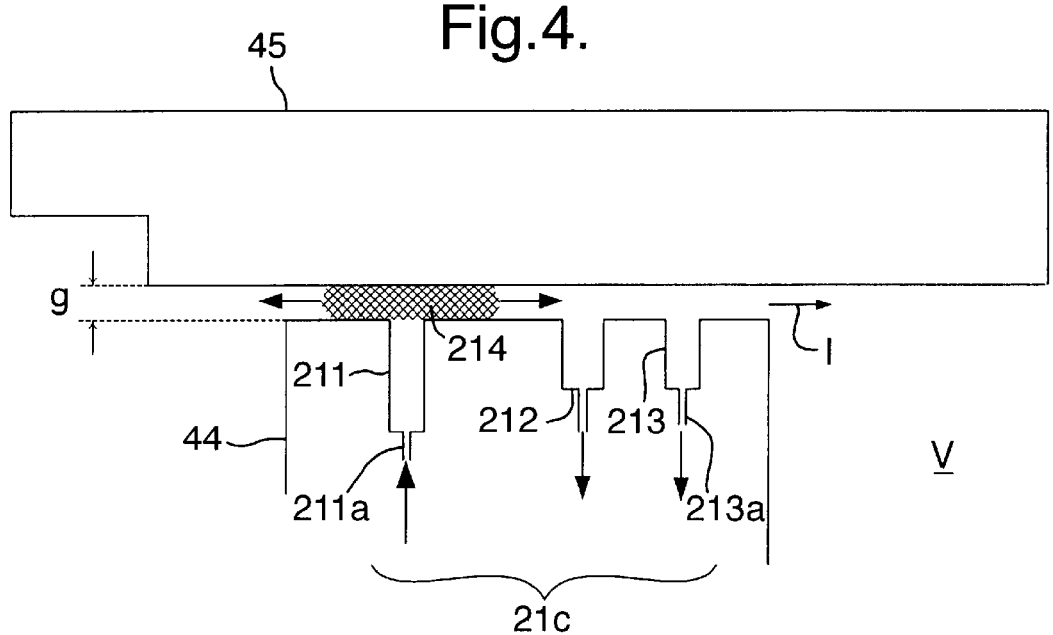
FIG. 4 is a cross-sectional view of a differential air bearing used in the second embodiment of the invention.

Bearing 21c provided in the seat 44 to allow movement of the seat relative to the plate 45 is generally depicted in FIG. 4. FIG. 4 is a cross-section through differential air-bearing 21c, showing part of the seat 44 and plate 45. Bearing 21c holds the seat 44 off the plate 45 by a constant gap, g, of 5 $\mu$m. In some applications a gap in the range of from 5 $\mu$m to 10 $\mu$m may be appropriate. Clan air (or other gas, e.g. $N_2$) is supplied continually through air feed 211 at a pressure of several atmospheres, to generate a high pressure region 214. The supplied air will flow harmlessly to the exterior (leftwards in the Figure) and also to the vacuum chamber V (rightwards in the Figure), where its presence would, of course, be undesirable. An escape path to atmospheric pressure is provided via groove 212. To prevent further the air that forms the air bearing becoming an unacceptable leak into the vacuum chamber V, it is pumped away via vacuum conduit 213. If desired, the escape path 212 may also be pumped. In this way, the residual leakage, 1, into the vacuum chamber V can be kept within acceptable levels.

In this embodiment the lower parts of the air feed 211 and the vacuum conduit 213 as well as the escape path 212 are elongate grooves extending along the entire length of the perimeter of the seal. Air feed pipe(s) 211a and vacuum pipe(s) 213a are provided at intervals along the grooves.

In the air bearing described above, a single vacuum groove is provided between the air feed 211 and the vacuum chamber V. In variants, two or more vacuum grooves may be provided, with those nearer the vacuum chamber V being pumped to higher vacuum levels.

The bearings 211a and b are similar, though provided in curved surfaces (cylindrical for bearing 21a and spherical for bearing 21b).

Embodiment 3

In a lithographic projection apparatus it is often desirable to mount two components, e.g. the beam emitting and detecting parts of an optical sensing system, so that their relative positions are fixed very precisely. This is often accomplished by mounting the two components to a reference frame which is made of a very stable material, such as Invar, and is isolated from other components of the apparatus, especially components which may create vibrations. However, in a lithographic projection apparatus having a vacuum chamber, if one of the components must be situated inside the vacuum chamber whereas the other is not vacuum compatible, use of a reference frame is problematic. The two components cannot be mounted to the vacuum chamber wall since the vacuum chamber wall will deform as the pressure differential across it changes. Such deformations will commonly amount to several tens of microns, which is excessive for many systems in lithographic projection apparatuses.

This problem is solved in a lithographic projection apparatus according to the third embodiment, relevant components of which are shown schematically in FIG. 5. A first component 61, e.g. a detector of a position sensing system, is mounted on a first reference frame 72 inside the vacuum chamber V. The first reference frame is made of a very stable material, e.g. Invar, and is isolated from any vibration causing or carrying components of the apparatus, including the vacuum chamber wall. The second component 62, e.g. the beam emitting part of the position detecting system, is mounted on a second reference frame 71 outside the vacuum chamber. (Note that the beam emitted by component 62 outside the vacuum chamber can easily be taken into the chamber via a window (not shown).) The second reference frame 72 is also made of a very stable material, e.g. Invar, and likewise isolated from vibration causing or carrying components, again including the vacuum chamber wall. The two reference frames 71, 72 are connected together, so as to fix their relative physical positions, via isolation mounts 40. These mounts may be functionally and structurally the same as those described in the first and second embodiments of the invention.

It can readily be seen that the first and second reference frames will be unaffected by deformation of the vacuum chamber wall V from its normal position, indicated in solid in FIG. 5, to a deformed position V', indicated in phantom in FIG. 5.

The invention is described above in relation to preferred embodiments; however it will be appreciated that the invention is not limited by the above description. In particular, the invention has been described above in relation to the wafer stage of a lithographic apparatus but is equally applicable to the mask stage of such an apparatus or to any apparatus in which a reference frame must be provided in a vacuum chamber. For example, the present invention may be employed in a transport or preparation apparatus used to transport wafers to a lithography apparatus, or to prepare wafers for exposure in such an apparatus.

We claim:

1. A lithographic projection apparatus, comprising:
   a radiation system constructed to supply a projection beam of radiation;
   a first object table provided with a mask holder for holding a mask;
   a second object table provided with a substrate holder for holding a substrate;
   a projection system constructed and arranged to image an irradiated portion of the mask onto a target portion of the substrate;
   a vacuum chamber having a wall enclosing at least one of said first and second object tables, said vacuum chamber wall having at least one aperture therein;
   a reference frame provided in said vacuum chamber;
   a position sensor constructed and arranged to sense the position of an object in said vacuum chamber relative to said reference frame; and
   a reference frame support passing through said aperture to support said reference frame from outside said vacuum chamber and to isolate said reference frame from said vacuum chamber wall.

2. An apparatus according to claim 1, further comprising a low-stiffness seal between said support and said vacuum chamber wall.

3. An apparatus according to claim 2, wherein said support comprises an elongate rod having a longitudinal axis; and said low-stiffness seal comprises:
   an annular collar rotatably provided around said elongate rod and having a first sealing surface concentric with said longitudinal axis;
   an intermediate member having second and third sealing surfaces, said second sealing surface being complementary to and opposing said first sealing surface; and
   a plate member defining an aperture through which said elongate rod passes and having a fourth sealing surface complementary to and opposing said third sealing surface, said plate member being sealed to said vacuum chamber wall.

4. An apparatus according to claim 3, wherein said first and second sealing surfaces are substantially spherical and said third and fourth sealing surfaces are substantially flat and preferably perpendicular to said longitudinal axis.

5. An apparatus according to claim 3, wherein said annular collar further comprises a fifth sealing surface complementary to and opposing the outer surface of said elongate rod.

6. An apparatus according to claim 5, wherein said fifth sealing surface is substantially cylindrical.

7. An apparatus according to claim 3, further comprising a bearing provided between at least one of the pairs of opposed surfaces.

8. An apparatus according to claim 7, wherein said bearing comprises a gas bearing adapted to supply pressurized gas to maintain a gap between the opposed surfaces, and an evacuating unit provided between said gas bearing and said vacuum chamber constructed and arranged to evacuate gas supplied to said gap.

9. A lithographic projection apparatus, comprising:
   a radiation system constructed to supply a projection beam of radiation;
   a first object table provided with a mask holder for holding a mask;
   a second object table provided with a substrate holder for holding a substrate;
   a projection system constructed and arranged to image an irradiated portion of the mask onto a target portion of the substrate;
   a vacuum chamber having a wall enclosing at least one of said first and object tables, said vacuum chamber wall having at least one aperture therein;
   a reference frame extending through said aperture so as to have a first part located in said vacuum chamber and a second part located outside said vacuum chamber; a position sensor having a first component mounted to said first part of said reference frame and a second component mounted to said second part of said reference frame; and
   a low-stiffness seal for sealing between said vacuum chamber wall and said reference frame.

10. A vacuum apparatus comprising:
    a vacuum chamber having a wall, said vacuum chamber wall having at least one aperture therein;
    a reference frame provided in said vacuum chamber;
    a position sensor constructed and arranged to sense the position of an object in said vacuum chamber relative to said reference frame; and
    a reference frame support passing through said aperture to support said reference frame from outside said vacuum chamber and to isolate said reference frame from said vacuum chamber wall.

11. A low-stiffness seal for sealing between a vacuum chamber wall and an elongate rod having a longitudinal axis and passing through an aperture in said vacuum chamber wall, the seal comprising:
    an annular collar rotatably mountable around said elongate rod and having a first sealing surface concentric with said longitudinal axis;
    an intermediate member having second and third sealing surfaces, said second sealing surface being complementary to and opposing said first sealing surface; and
    a plate member defining an aperture through which said elongate rod passes and a fourth sealing surface complementary to and opposing said third sealing surface, said plate member being mountable to said pressure chamber wall.

12. A seal according to claim 11, wherein said first and second sealing surfaces are substantially spherical and said third and fourth sealing surfaces are substantially flat.

13. A seal according to claim 11, wherein said annular collar further comprises a fifth sealing surface complementary to and opposing an outer surface of said elongate rod.

14. A seal according to claim 13, wherein said fifth sealing surface is substantially cylindrical.

15. A seal according to claim 11, further comprising a bearing provided between at least one of the pairs of opposed surfaces.

16. A seal according to claim 15, wherein said bearing comprises a gas bearing adapted to supply pressurized gas to maintain a gap between the opposed surfaces, and an evacuating unit provided between said air bearing and said pressure chamber constructed and arranged to evacuate gas supplied to said gap.

17. A device manufacturing method, comprising:
    providing a substrate which is at least partially covered by a layer of energy-sensitive material;
    providing a mask containing a pattern;
    projecting an image of at least part of the mask pattern onto a target area of the layer of energy-sensitive material using a projection beam of radiation;

wherein at least one of said substrate and said mask is provided in a vacuum chamber; and the one of said mask or said substrate is positioned relative to a reference frame provided in said vacuum chamber, said reference frame being supported from outside said vacuum chamber and isolated from the walls of said vacuum chamber.

18. A device manufactured in accordance with the method of claim 17.

19. A seal according to claim 12, wherein said third and fourth surfaces are substantially perpendicular to said longitudinal axis.

* * * * *